US012601979B2

(12) United States Patent
Vaknin et al.

(10) Patent No.: US 12,601,979 B2
(45) Date of Patent: Apr. 14, 2026

(54) MULTI-COLUMN LARGE FIELD OF VIEW IMAGING PLATFORM

(71) Applicant: KLA Corporation, Milpitas, CA (US)

(72) Inventors: Yonatan Vaknin, Yoqneam Llit (IL); Amnon Manassen, Haifa (IL); Andrew V. Hill, Sunriver, OR (US)

(73) Assignee: KLA Corporation, Milpitas, CA (US)

( * ) Notice: Subject to any disclaimer, the term of this patent is extended or adjusted under 35 U.S.C. 154(b) by 243 days.

(21) Appl. No.: 18/368,795

(22) Filed: Sep. 15, 2023

(65) Prior Publication Data

US 2025/0093786 A1      Mar. 20, 2025

(51) Int. Cl.
*G03F 7/00*          (2006.01)

(52) U.S. Cl.
CPC .... *G03F 7/70633* (2013.01); *G03F 7/706849* (2023.05); *G03F 7/706851* (2023.05)

(58) Field of Classification Search
CPC .......... G03F 7/70633; G03F 7/706849; G03F 7/706851
See application file for complete search history.

(56) References Cited

U.S. PATENT DOCUMENTS 7,315,384 B2    1/2008  Den Boef et al.
9,184,102 B2    11/2015 Finarov et al.

11,640,116 B2 *    5/2023   Den Boef ........... G03F 7/70616
                                                                                   355/72
12,066,764 B2 *    8/2024   Tinnemans ............. G03F 7/705
12,111,580 B2 *    10/2024  Manassen ............ G01N 21/956
12,276,921 B2 *    4/2025   Zwier ................ G01N 21/4788
2007/0127025 A1    6/2007   Abdulhalim et al.
2018/0051984 A1    2/2018   Shchegrov et al.
2022/0214285 A1    7/2022   Hill et al.

OTHER PUBLICATIONS

Korean Intellectual Property Office, International Search Report and Written Opinion received in International Application No. PCT/US2024/044942, Dec. 12, 2024, 10 pages.

* cited by examiner

*Primary Examiner* — Hung V Nguyen
*Assistant Examiner* — Hung Henry Nguyen
(74) *Attorney, Agent, or Firm* — Suiter Swantz IP

(57)          ABSTRACT

A measurement system may include an illumination source configured to generate one or more illumination beams and one or more objective lenses. One or more of the objective lenses may be configured as illumination objective lenses to direct illumination from the illumination source to one or more targets on a sample. One or more of the objective lenses may be configured as collection objective lenses, where each of the collection objective lenses is configured to collect a selected diffraction order of the illumination from the sample. The system may further include one or more detectors, each configured to image the sample based on at least one of the selected diffraction orders from at least one of the collection objective lenses and a controller to generate measurements of the one or more targets on the sample based on one or more images from the detectors.

24 Claims, 8 Drawing Sheets

300

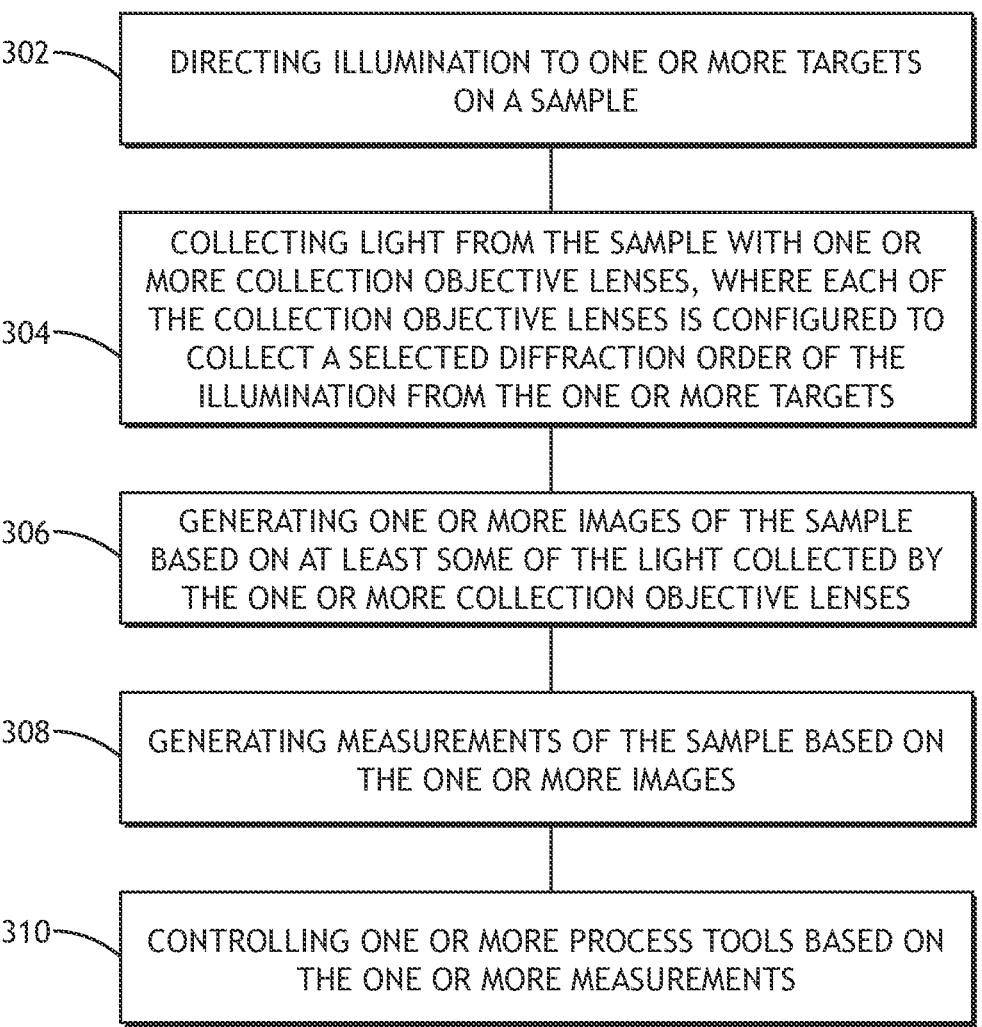

302 — DIRECTING ILLUMINATION TO ONE OR MORE TARGETS ON A SAMPLE

304 — COLLECTING LIGHT FROM THE SAMPLE WITH ONE OR MORE COLLECTION OBJECTIVE LENSES, WHERE EACH OF THE COLLECTION OBJECTIVE LENSES IS CONFIGURED TO COLLECT A SELECTED DIFFRACTION ORDER OF THE ILLUMINATION FROM THE ONE OR MORE TARGETS

306 — GENERATING ONE OR MORE IMAGES OF THE SAMPLE BASED ON AT LEAST SOME OF THE LIGHT COLLECTED BY THE ONE OR MORE COLLECTION OBJECTIVE LENSES

308 — GENERATING MEASUREMENTS OF THE SAMPLE BASED ON THE ONE OR MORE IMAGES

310 — CONTROLLING ONE OR MORE PROCESS TOOLS BASED ON THE ONE OR MORE MEASUREMENTS

FIG.3

MULTI-COLUMN LARGE FIELD OF VIEW IMAGING PLATFORM

TECHNICAL FIELD

The present disclosure relates generally to diffraction-based measurements and, more particularly, to measurements based on diffraction orders captured by dedicated collection systems.

BACKGROUND

A common trade-off in non-coherent imaging systems is between field size describing a size of an imaged portion of a sample and pupil size describing an angular spread of collected light. The cost of an objective lens generally scales rapidly with etendue, which is associated with a multiplication of field and pupil sizes. For a given etendue, increasing the field size generally reduces the pupil size and vice versa. However, some applications may benefit from both large field size and large collection angles while minimizing cost. There is therefore a need to develop systems and methods to cure the above deficiencies.

SUMMARY

A measurement system is disclosed in accordance with one or more illustrative embodiments of the present disclosure. In one illustrative embodiment, the system includes an illumination source configured to generate one or more illumination beams. In another illustrative embodiment, the system includes one or more objective lenses. One or more of the objective lenses may be configured as illumination objective lenses to direct illumination from the illumination source to one or more targets on a sample when implementing a recipe. One or more of the objective lenses may be configured as collection objective lenses, where each of the collection objective lenses is configured to collect a selected diffraction order of the illumination from the sample when implementing the recipe. In another illustrative embodiment, the system includes one or more detectors, each configured to image the sample based on at least one of the selected diffraction orders from at least one of the collection objective lenses. In another illustrative embodiment, the system includes a controller to implement the recipe by generating measurements of the one or more targets on the sample based on one or more images from the one or more detectors.

A measurement system is disclosed in accordance with one or more illustrative embodiments of the present disclosure. In one illustrative embodiment, the system includes a controller coupled to one or more detectors configured to image a sample based on at least some of the light collected by one or more collection objective lenses when implementing a recipe, where each of the collection objective lenses is configured to collect a selected diffraction order of the illumination from the sample when implementing the recipe. In another illustrative embodiment, the controller implements the recipe by generating measurements of the one or more targets on the sample based on one or more images from the one or more detectors.

A method is disclosed in accordance with one or more illustrative embodiments of the present disclosure. In one illustrative embodiment, the method includes directing illumination to one or more targets on a sample. In another illustrative embodiment, the method includes collecting light from the sample with one or more collection objective lenses, where each of the collection objective lenses is configured to collect a selected diffraction order of the illumination from the one or more targets. In another illustrative embodiment, the method includes generating one or more images of the sample based on at least some of the light collected by the one or more collection objective lenses. In another illustrative embodiment, the method includes generating measurements of the one or more targets on the sample based on the one or more images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 3 is a flow diagram illustrating steps performed in a method, in accordance with one or more embodiments of the present disclosure.

DETAILED DESCRIPTION

Figure 1A:
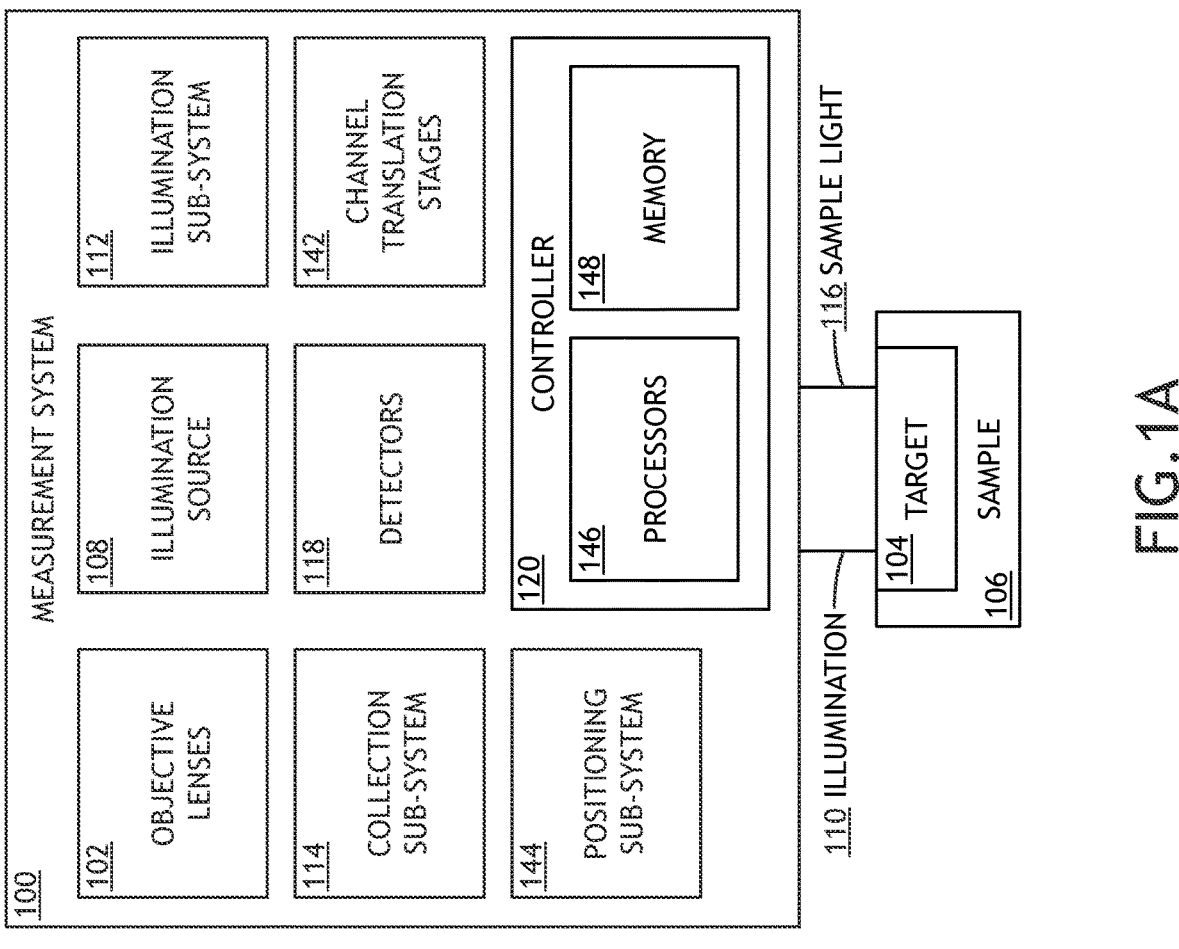
FIG. 1A is a block diagram of a measurement system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods providing diffraction-based imaging of a sample (e.g., a target on a sample) based on collection of selected diffraction orders from the sample with dedicated objectives. In this configuration, both illumination of the sample and collection of light from the sample may be achieved with relatively low numerical aperture (NA) objective lenses to achieve a large field size (e.g., field of view (FOV)) while also capturing diffraction orders of light at wide emission angles from the sample. It is contemplated herein that such a configuration may both enable more generous measurement tolerances (e.g., defocus, or the like) for any particular target and also enable simultaneous high-contrast imaging of multiple small targets within a field of view.

It is contemplated herein that techniques reliant on a single objective lens to image a sample may be limited by the etendue of the objective lens. In this configuration, the resolved feature size is generally related to the NA of the objective lens such that imaging relatively small targets and/or small feature sizes on the targets requires a relatively large NA and correspondingly small field of view. Such a relatively large NA may limit the size and/or number of targets that may fit within the small field of view and may introduce strict tolerances on imaging conditions such as, but not limited to, defocus (e.g., sample height), sample positioning (e.g., accuracy and/or stability of a translation stage securing the sample), sensitivity to pupil non-uniformities and associated aberrations, or sensitivity to target-induced asymmetries.

In some embodiments, images are generated using multiple collection objective lenses, which may be the same or different than an objective lens used for illumination. Such a configuration may be particularly suitable for, but is not limited to, diffraction-based imaging techniques in which a target includes periodic features that diffract incident illumination into distinct diffraction orders. In this configuration, different collection objective lenses may collect different diffraction orders. It is contemplated herein that such a configuration may overcome etendue limitations associated with a single collection objective lens. For example, each collection objective lens may have a relatively low NA suitable for capturing the associated diffraction orders, which may enable a correspondingly larger field of view and reduced imaging tolerances without sacrificing image quality. Images may be generated from light collected from a single objective lens or from combinations of objective lenses to support a wide range of imaging techniques. As another example, each collection objective lens may be separately positioned to capture light around any range of emission angles. Advantageously, low NA objective lenses typically have or may support relatively long working distances to the sample such that multiple objective lenses (e.g., objective lenses used for illumination and/or collection) may be aligned to a common field of view on the sample without physically obstructing each other. Further, such low NA objective lenses need not necessarily have a high etendue and may thus be relatively low cost. This combination of a relatively large field of view and flexibility to capture light emitted at any angle may also enable the simultaneous imaging of multiple small targets having small features (e.g., small-pitch periodic structures).

Some embodiments of the present disclosure are directed to a measurement tool configured to provide one or more measurements of one or more targets based on a recipe.

Some embodiments of the present disclosure are directed to a target configured in accordance with a recipe for characterization by a measurement tool. Some embodiments of the present disclosure are directed to methods for generating one or more measurements of one or more targets on one or more samples in accordance with a recipe.

Referring now to FIGS. 1A-3, systems and methods for multi-column large FOV measurements are described in greater detail, in accordance with one or more embodiments of the present disclosure.

FIG. 1A is a block diagram of a measurement system 100, in accordance with one or more embodiments of the present disclosure.

In some embodiments, the measurement system 100 includes two or more objective lenses 102 for illumination of one or more targets 104 on a sample 106 and collection of light within different emission angles from the one or more targets 104. For example, the measurement system 100 may include an illumination source 108 configured to generate illumination 110 in the form of one or more illumination beams, an illumination sub-system 112 to direct the illumination 110 to one or more targets 104 on a sample 106 through at least one of the objective lenses 102, a collection sub-system 114 to collect light from the one or more targets 104 (referred to herein as sample light 116) through at least one of the objective lenses 102, one or more detectors 118 to image the one or more targets 104 based on sample light 116 from any of the objective lenses 102, and a controller 120 to generate one or more measurements of the sample 106 (or any targets 104 thereon) based on at least a portion of the collected sample light 116.

In some embodiments, the measurement system 100 is configured as a diffraction-based imaging system. In this way, a target 104 on a sample 106 may include periodic features configured to diffract incident illumination 110 and the measurement system 100 may be configured to capture selected diffraction orders of the illumination 110 (e.g., sample light 116) by the target 104 with selected objective lenses 102. For example, a particular objective lens 102 may be configured to collect one or more selected diffraction orders from the targets 104 (e.g., as a collection objective lens). The measurement system 100 may then include one or more detectors 118 at one or more field planes (e.g., planes conjugate to the sample 106) to generate one or more images of the sample 106 based on the collected sample light 116. Any particular detector 118 may generate an image based on sample light 116 (e.g., diffraction orders) collected by a single objective lens 102 or by multiple objective lenses 102.

The measurement system 100 may operate as any type of optical system providing any type of measurements of a sample 106. In some embodiments, the measurement system 100 is a metrology system that may generate one or more measurements associated with one or more properties of the sample 106. For example, the measurement system 100 may be an overlay metrology system suitable for generating overlay measurements associated with a registration (or misregistration) between features fabricated with two or more lithographic exposures on one or more layers of the sample 106. As another example, the measurement system 100 may be an inspection system suitable for detecting and/or characterizing one or more defects on a sample 106.

In a general sense, the sample 106 may include any type of material suitable including a target 104 suitable for measurement with the measurement system 100. For example, the sample 106 may include, but is not limited to, a substrate formed of a semiconductor or non-semiconductor material (e.g., a wafer, or the like) as well as any number of films, layers, or structures thereon. A semiconductor or non-semiconductor material may include, but is not limited to, monocrystalline silicon, gallium arsenide, and indium phosphide. Further, layers on a sample 106 may include, but is not limited to, a dielectric material, a conductive material, and a semiconductive material, or a resist material. Further, layers on a sample 106 may be patterned or unpatterned. In some embodiments, a sample 106 includes multiple dies, each having repeatable patterned features. Formation and processing of such layers of material may ultimately result in completed devices.

Further, a target 104 may include any portion of a sample 106 suitable for characterization based on the systems and methods disclosed herein and may include any combination of features designed for a measurement or features associated with a device being fabricated. In some embodiments, a target 104 includes a set of periodic features that may operate as a diffraction grating and thus generate discrete diffraction orders in response to incident illumination. A target 104 may further include or be characterized as having features with one or more characteristic pitches, where the features may be located at any depth or combination of depths within the sample. As an illustration, a target used for overlay metrology may include periodic structures on two or more sample layers of interest. In this way, an overlay measurement associated with registration (or misregistration) between the sample layers may be obtained based on collected diffraction orders from the target 104. Further, a target 104 may include features associated with any process step associated with a fabrication process. For example, a target 104 may include one or more features in one or more process layers (e.g., after an etch process or other suitable process) and/or one or more features in one or more resist layers (e.g., after a development process). In this way, the target 104 may be suitable for after development inspection (ADI) and/or after etch inspection (AEI) measurements.

Figure 2A:
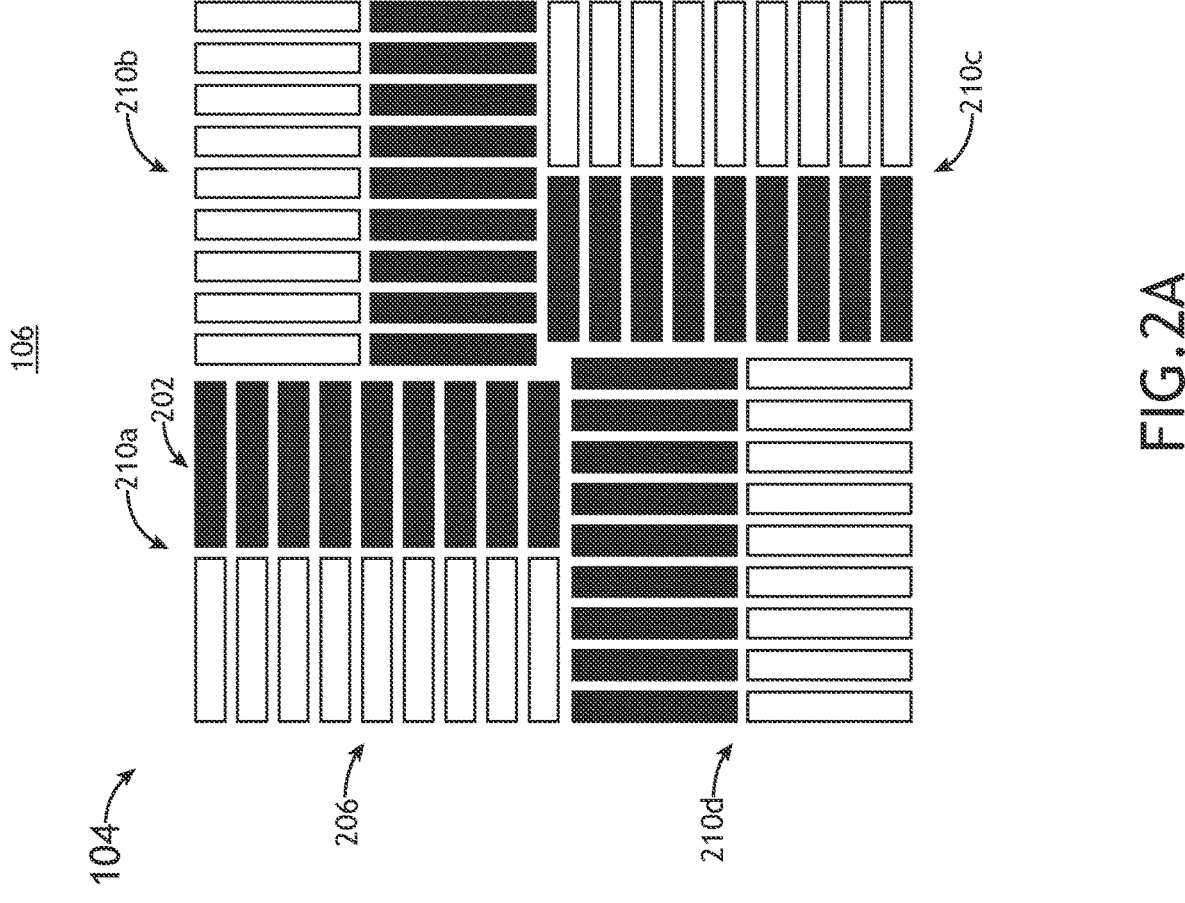
FIG. 2A is a top view of a target with non-overlapping features, in accordance with one or more embodiments of the present disclosure.
Figure 2A:
Figures 2B, 2C:
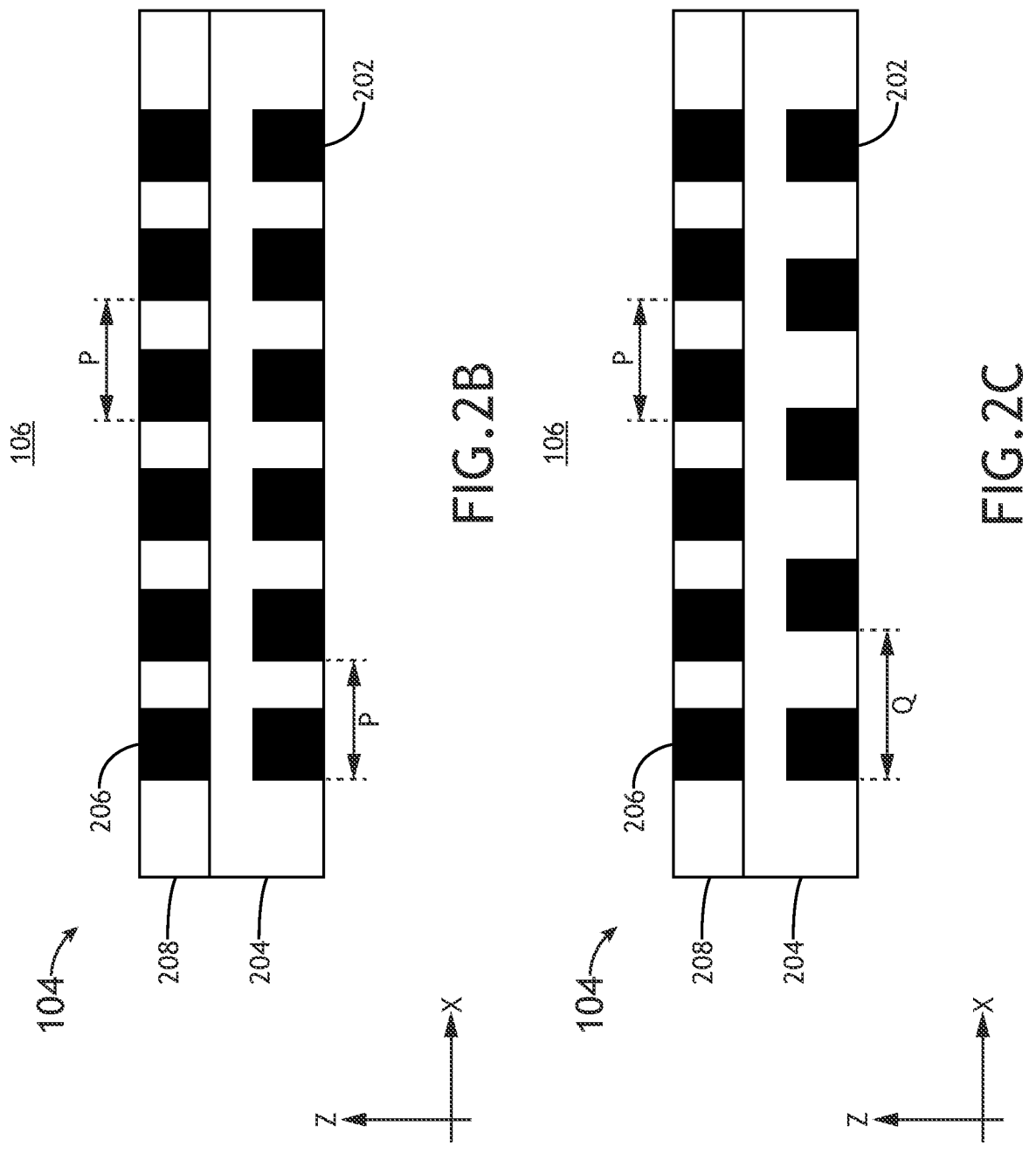
FIG. 2B is a side view of a first target with overlapping features having a common pitch, in accordance with one or more embodiments of the present disclosure.
FIG. 2C is a side view of a second target with overlapping features having different pitches, in accordance with one or more embodiments of the present disclosure.

FIGS. 2A-2C depict various non-limiting examples of targets 104 having periodic features suitable for measurement with the measurement system 100. In a general sense, a target 104 may have periodic features on a single layer of the sample 106 or on multiple layers of the sample 106. In cases with periodic features on multiple layers of the sample 106, these features may be in overlapping or non-overlapping regions. A target 104 may include features with one or more characteristic pitches or periods along one or more directions. Additionally, a target 104 may include one or more cells, each with potentially different arrangement of features.

Further, FIGS. 2A-2C depict various of a configuration of a target 104 having first-layer printed features 202 located on a first layer 204 of the sample 106 and second-layer printed features 206 located on a second layer 208 of the sample 106. However, this is merely illustrative and not limiting. A target 104 may generally include features on any number of sample layers.

FIG. 2A is a top view of a target 104 with non-overlapping features, in accordance with one or more embodiments of the present disclosure. For example, the target 104 in FIG. 2A may be suitable for, but is not limited to, image-based overlay or various diffraction-based overlay methods and may be characterized as an advanced imaging metrology (AIM) target. The target 104 illustrated in FIG. 2A includes four cells 210a-d, represented here as quadrants of the target 104. Each cell 210a-d may include first-layer printed features 202 located on a first layer 204 of the sample 106 and second-layer printed features 206 located on a second layer 208 of the sample 106.

Further, cell 210b and cell 210d may be configured to provide overlay measurements along the X direction as illustrated in FIG. 2A. For instance, an overlay measurement along the X direction may be made by directly comparing relative positions of the first-layer printed features 202 and the second-layer printed features 206 within each cell or between cell 210b and cell 210d. In another instance, an overlay measurement along the X direction may be made by comparing a point of rotational symmetry (e.g., rotational symmetry, reflection symmetry, mirror symmetry, or the like) between first-layer printed features 202 distributed across cell 210b and cell 210d with a point of symmetry between second-layer printed features 206 distributed across cell 210b and cell 210d. Similarly, cell 210a and cell 210c may be configured to provide overlay measurements along the Y direction as illustrated in FIG. 2A.

It is noted that although the first-layer printed features 202 and the second-layer printed features 206 have a common pitch in FIG. 2A, this is merely illustrative and not a limitation.

FIGS. 2B-2C depict side views of different configurations of a target 104 (or a cell thereof) with overlapping features, in accordance with one or more embodiments of the present disclosure. FIG. 2B is a side view of a first target 104 (or a cell thereof) with overlapping features having a common pitch (P), in accordance with one or more embodiments of the present disclosure. FIG. 2C is a side view of a second target 104 (or a cell thereof) with overlapping features having different pitches, in accordance with one or more embodiments of the present disclosure. For example, the first-layer printed features 202 are shown with a pitch (Q) and the second-layer printed features 206 are shown with a pitch (P). Broadly, the overlapping features in FIGS. 2B-2C may be characterized as grating-over-grating (GoG) structures.

In some embodiments, a target 104 multiple cells having different GoG structures. For example, some scatterometry overlay (SCOL) techniques may characterize targets 104 having multiple cells, each with GoG structures having common pitches but different intentional offsets. As another example, some SCOL techniques may characterize targets 104 having multiple cells, each with GoG structures having different pitches (e.g., Moiré structures) but in different arrangements. For example, a first cell may include first-layer printed features 202 having a pitch P and second-layer printed features 206 having a pitch Q, whereas a second cell may include first-layer printed features 202 having the pitch Q and second-layer printed features 206 having the pitch P.

Referring generally to FIGS. 2A-2C, a target 104 (or a cell thereof) may include features on any number of layers of the sample 106 (e.g., one or more sample layers). In this way, depictions of targets 104 including features on two sample layers is merely illustrative and not limiting. Further, although FIGS. 2A-2C and the associated descriptions were described in the context of overlay measurements, this is also merely illustrative and not limiting. Any target 104 having any arrangement of periodic structures may be characterized by the measurement system 100.

Referring now to FIGS. 1B-1E, multi-channel collection of selected diffraction orders is described in greater detail, in accordance with one or more embodiments of the present disclosure.

In a general sense, each objective lens 102 may be used for illumination and/or collection (e.g., as an illumination collection lens or as a collection objective lens). Further, the measurement system 100 may include any number of detectors 118, which may image the sample 106 (e.g., one or more targets 104) based on sample light 116 collected by any combination of the objective lenses 102.

In some embodiments, one or more objective lenses 102 are arranged to capture one or more selected diffraction orders (e.g., sample light 116) associated with diffraction of incident illumination 110 by one or more targets 104.

Figure 1B:
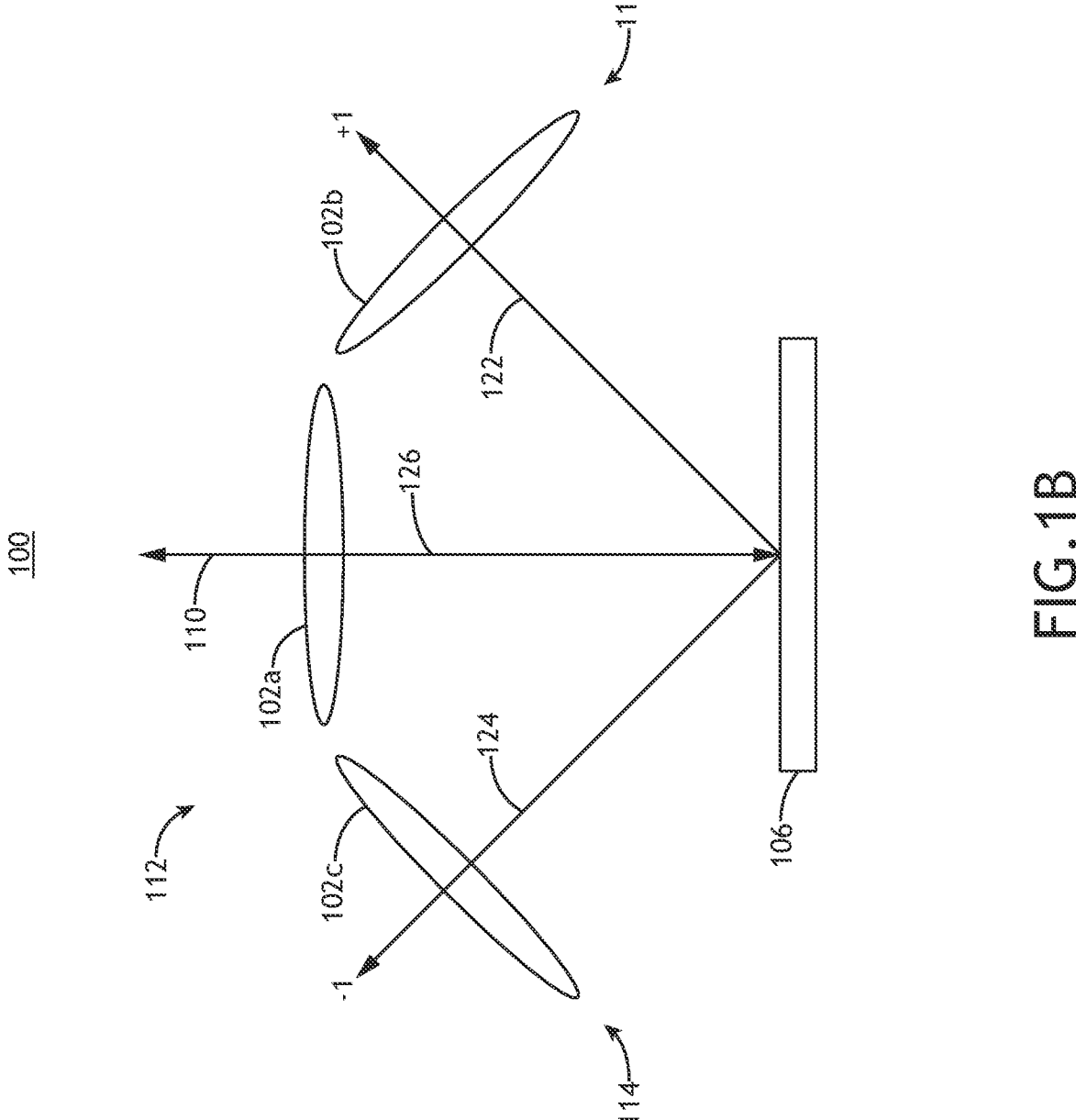
FIG. 1B is a simplified schematic view of a portion of a measurement system illustrating the collection of positive and negative first-order diffraction with dedicated objective lenses, in accordance with one or more embodiments of the present disclosure.

FIG. 1B is a simplified schematic view of a portion of a measurement system 100 illustrating the collection of positive and negative first-order diffraction with dedicated objective lenses 102, in accordance with one or more embodiments of the present disclosure. For example, FIG. 1B depicts a first objective lens 102a oriented to direct illumination 110 to a sample 106 at a normal incidence angle, a second objective lens 102b oriented to collect positive first-order diffraction 122 (e.g., +1 order diffraction) from the sample 106, and a third objective lens 102c oriented to collect negative first-order diffraction 124 (−1 order diffraction) from the sample 106. In this configuration, the first objective lens 102 may also collect 0-order diffraction 126 from the target 104 or other light within a NA of the first objective lens 102a such as, but not limited to, double diffraction.

It is contemplated herein that collecting selected diffraction orders from a target 104 with dedicated objective lenses 102 (e.g., the second objective lens 102b and the third objective lens 102c in FIG. 1B) may require coordination between various parameters of the target 104 and the measurement system 100.

In some embodiments, the measurement system 100 and/or a target 104 to be characterized by the measurement system 100 are configurable according to a recipe, which may include parameters of the measurement system 100 (e.g., illumination source 108, the illumination sub-system 112, the collection sub-system 114, the controller 120, or the like) and/or the target 104 suitable for providing a measurement in accordance with a particular technique. For example, a recipe may include parameters of the illumination 110 such as, but not limited to, a spectrum, a polarization, an illumination pupil distribution (e.g., a distribution of illumination angles and associated intensities of illumination at those angles), or a spatial distribution. As another example, a recipe may include collection parameters such as, but not limited to, collection angles (e.g., angular positions of any of the objective lenses 102), collection field stop settings to select portions of the sample of interest, polarization of collected light, or wavelength filters. As another example, a recipe may include parameters of a target 104 such as, but not limited to, a distribution of features on one or more sample layers providing one or more characteristic pitches or a number of zones of interest (e.g., cells) having different distributions of features. As another example, a recipe may include one or more analysis steps suitable for generating a selected measurement based on light collected from the target 104.

For instance, a distribution of diffracted sample light 116 from periodic features on a target 104 may depend on parameters such as, but not limited to, a pitch of the periodic features, a wavelength of incident illumination 110, or an angle of incidence of the illumination 110. In some embodiments, a recipe defines parameters of the target 104 and/or the measurement system 100 to provide a desired distribution of diffraction orders for one or more measurements. A recipe may thus be used to co-design or co-optimize a target 104 and a measurement system 100 to facilitate a desired measurement. Additionally, a recipe may provide properties of multiple targets 104 of the same or different types distributed across a sample 106 as well as configurations of the measurement system 100 suitable for characterizing the various targets 104.

As described above, collecting selected diffraction orders with dedicated objective lenses 102 may provide numerous benefits. For example, the systems and methods disclosed herein may enable accurate characterization of relatively small targets 104 having features with fine pitches.

Using FIG. 1B as an example, the positive first-order diffraction 122 and the negative first-order diffraction 124 need not fall within the NA of any single lens (e.g., the first objective lens 102a). Rather, the second objective lens 102b and the third objective lens 102c provide additional flexibility to scale down the pitch and thus the overall size of the target 104. In a general sense, an angle of diffraction of illumination 110 of a given wavelength (e.g., an emission angle of associated sample light 116) increases as the pitch decreases. While traditional systems with a single collection lens may be limited to wavelength and pitch configurations providing multiple diffraction orders within the NA of that collection lens, the use of dedicated objective lenses 102 to collect selected diffraction orders does not suffer from this limitation. Rather, the wavelength and pitch may be selected (e.g., in accordance with a recipe) to provide diffracted orders with large angular separation since each objective lens 102 used for collection only needs to capture a single diffraction order.

Figure 1C:
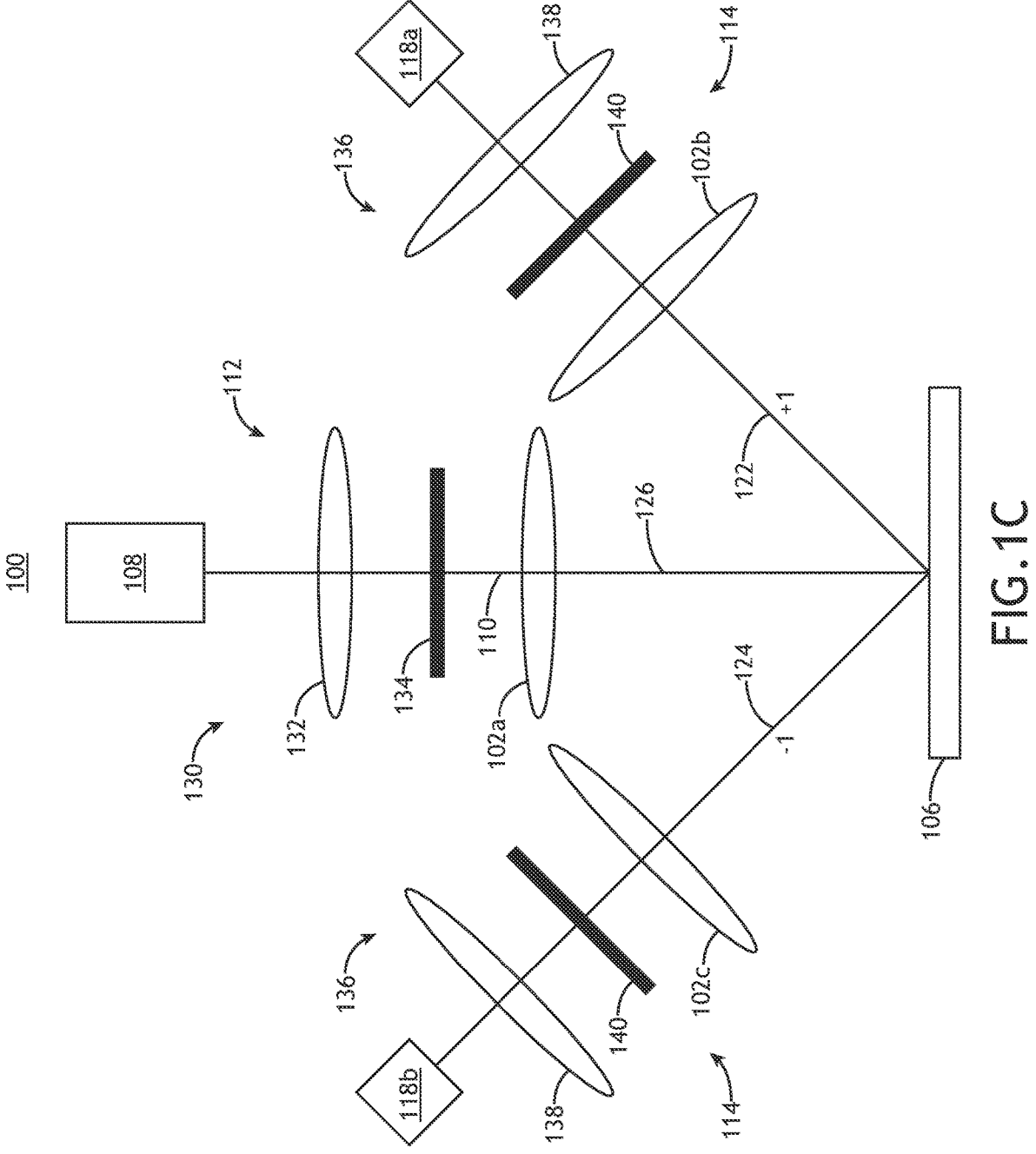
FIG. 1C is a simplified conceptual diagram of a measurement system with three objective lenses and two detectors, each arranged to capture images based on sample light from a single objective lens, in accordance with one or more embodiments of the present disclosure.
Figure 1D:
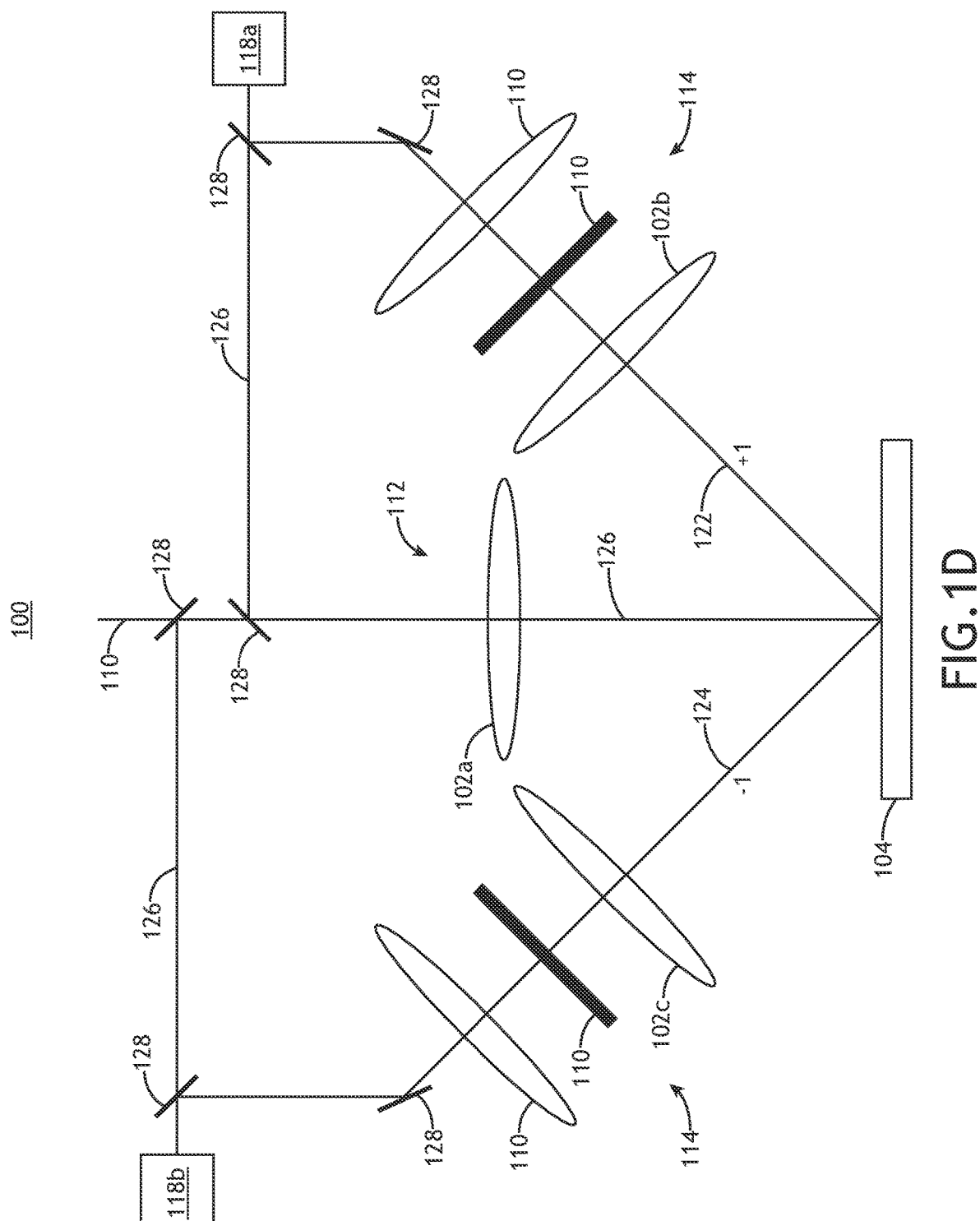
FIG. 1D is a simplified conceptual diagram of a measurement system with three objective lenses and two detectors, each arranged to capture images based on sample light from multiple objective lenses, in accordance with one or more embodiments of the present disclosure.
Figure 1E:
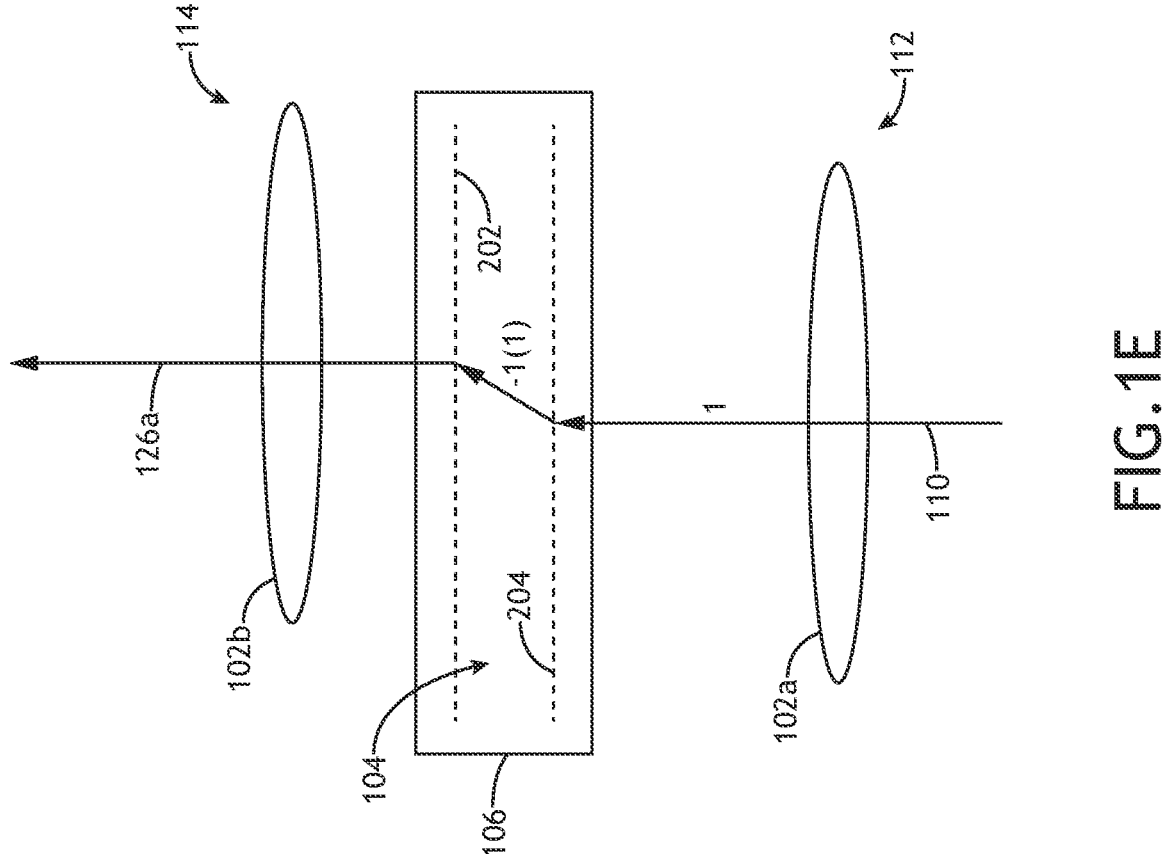
FIG. 1E is a simplified conceptual diagram of a measurement system with a two objective lenses and one detector, in accordance with one or more embodiments of the present disclosure.

Referring now to FIGS. 1C-1E, various configurations of the measurement system 100 suitable for different imaging techniques are described in greater detail, in accordance with one or more embodiments of the present disclosure. It is noted that although FIGS. 1C-1E depict a particular configuration of a single illumination objective lens 102 providing illumination 110 at a normal incidence angle, this is merely illustrative and not limiting. In a general sense, any of the objective lenses 102 may direct illumination 110 and any of the objective lenses 102 may collect sample light 116 and thus be referred to as collection objective lenses. In some embodiments, the configuration of the objective lenses 102 may be dynamically changed (e.g., using shutters controlling alternate paths, or the like) to enable flexible imaging under various conditions. It is noted that sample light 116 is not expressly identified in FIGS. 1C-1E, but rather the associated diffraction orders (e.g., positive first-order diffraction 122, negative first-order diffraction 124, 0-order diffraction 126, and the like) are identified.

FIG. 1C is a simplified conceptual diagram of a measurement system 100 with three objective lenses 102 and two detectors 118, each arranged to capture images based on sample light 116 from a single objective lens 102, in accordance with one or more embodiments of the present disclosure.

In FIG. 1C, the first objective lens 102a directs illumination 110 to the sample 106 at normal incidence. A first detector 118a generates an image of the sample 106 based on positive first-order diffraction 122 from one or more illuminated targets 104 collected by the second objective lens 102b. A second detector 118b generates an image of the sample 106 based on negative first-order diffraction 124 from the one or more illuminated targets 104 collected by the third objective lens 102c. Although not shown for simplicity, the measurement system 100 may include additional components (e.g., mirrors, lenses, stops, apodizers, or the like) suitable for directing and/or conditioning the illumination 110 and/or the sample light 116.

Such a configuration may be suitable for, but not limited to, field SCOL measurements based on grey-levels of unresolved grating features in one or more cells. For example, a field SCOL measurement may be achieved based on such separate imaging with positive first-order diffraction 122 and negative first-order diffraction 124 of a target 104 with multiple cells, each having a GoG in which first-layer printed features 202 and second-layer printed features 206 have a common pitch but different intentional offsets along a measurement direction. For instance, each cell may correspond to a variation of the features depicted in FIG. 2B. In this configuration, each cell will appear as a solid area with a single grey level in each image, where overlay between the associated sample layers may be determined based on a comparison of the grey levels between images based on positive first-order diffraction 122 and negative first-order diffraction 124 for the various cells.

FIG. 1D is a simplified conceptual diagram of a measurement system 100 with three objective lenses 102 and two detectors 118, each arranged to capture images based on sample light 116 from multiple objective lenses 102, in accordance with one or more embodiments of the present disclosure.

In FIG. 1D, the first objective lens 102a directs illumination 110 to the sample 106 at normal incidence and further captures 0-order diffraction 126. A first detector 118a generates an image of the sample 106 based on positive first-order diffraction 122 from one or more illuminated targets 104 collected by the second objective lens 102b overlapped with a portion of the 0-order diffraction 126 from the first objective lens 102a. A second detector 118b generates an image of the sample 106 based on negative first-order diffraction 124 from the one or more illuminated targets 104 collected by the third objective lens 102c overlapped with a portion of the 0-order diffraction 126 from the first objective lens 102a. For example, as illustrated in FIG. 1D, the measurement system 100 may include one or more beamsplitters 128 to split the collected 0-order diffraction 126 along multiple paths to the first detector 118a and the second detector 118b.

Such a configuration may be suitable for, but not limited to, measurements based on bright-field imaging of resolved features on one or more targets 104. For example, such a configuration may be suitable for, but not limited to, imaging of non-overlapping features as depicted in FIG. 2A.

As an illustration of a case where the first-layer printed features 202 and the second-layer printed features 206 have a common pitch, the first-order diffraction from these features (e.g., positive first-order diffraction 122 and negative first-order diffraction 124) and be captured by corresponding objective lenses 102b,c.

As another illustration of a case where the first-layer printed features 202 and the second-layer printed features 206 have different pitches, the pitches and/or the wavelengths of illumination 110 may be selected (e.g., in accordance with a recipe) to provide for the capture of positive first-order diffraction 122 and negative first-order diffraction 124 from both layers by the corresponding objective lenses 102b,c. The emission angle of first-order diffraction may be related to the ratio $\lambda/p$, where $\lambda$ is the wavelength of illumination 110 and p is the pitch of target features. As a result, a common emission angle may be achieved from features with different pitches using multi-wavelength illumination 110. For example, the measurement system 100 may illuminate a target 104 including pitches $p_1$ and $p_2$ with illumination 110 having two wavelengths (e.g., two central wavelengths) $\lambda_1$ and $\lambda_2$ selected to preserve the following condition:

$$\frac{\lambda_1}{p_1} = \frac{\lambda_2}{p_2}. \tag{1}$$

Such a configuration may further support multiple imaging methods. In some embodiments, a single first detector 118a may image the sample 106 based on 0-order diffraction 126 and positive first-order diffraction 122, while a single second detector 118b may image the sample 106 based on 0-order diffraction 126 and negative first-order diffraction 124. For example, the first detector 118a and the second detector 118b may be color detectors, where measurements of particular features (e.g., first-layer printed features 202 or second-layer printed features 206) are based on data associated with the corresponding same wavelengths from both detectors 118. In some embodiments, the measurement system 100 includes wavelength-selective beamsplitters (e.g., dichroic beamsplitters) to separate the sample light 116 based on wavelength into different paths (e.g., different channels) to be sent to different detectors 118. For example, the measurement system 100 may include a first pair of detectors 118 to separately image the sample 106 based on 0-order diffraction 126 overlapped with positive first-order diffraction 122 and negative first-order diffraction 124 with the wavelength $\lambda_1$ and a second pair of detectors 118 to separately image the sample 106 based on 0-order diffraction 126 overlapped with positive first-order diffraction 122 and negative first-order diffraction 124 with the wavelength 12.

FIG. 1E is a simplified conceptual diagram of a measurement system 100 with a two objective lenses 102 and one detector 118, in accordance with one or more embodiments of the present disclosure.

In FIG. 1E, a first objective lens 102a directs illumination 110 to the sample 106 at normal incidence, while a second objective lens 102b collects double diffraction 126a from the first-layer printed features 202 and the second-layer printed features 206. Such a configuration may be suitable for, but is not limited to, 0-order SCOL measurements based on multiple cells that each have different intended offsets. FIG. 1E further depicts a transmission configuration in which a double-diffracted order 126a is transmitted through the sample 106, which may provide a high signal to noise ratio (SNR) by avoiding specular reflection from faces of the sample 106. However, this is merely an illustration and not limiting.

Referring now generally to FIGS. 1A-1E, additional aspects of the measurement system 100 are described with greater detail, in accordance with one or more embodiments of the present disclosure. It is noted that not all components are depicted in each of FIGS. 1A-1E for clarity, but any of the described components may be extended to any of the FIGS. 1A-1E. In this way, depiction of any component (or lack thereof) in any of FIGS. 1A-1E is merely illustrative and not limiting. Further, any collected diffraction order may generally be a reflected diffraction order (e.g., as depicted in FIGS. 1B-1D) or a transmitted diffraction order (e.g., as depicted FIG. 1E).

The illumination source 108 may include any type of illumination source suitable for providing at least one illumination 110. In one embodiment, the illumination source 108 is a laser source. For example, the illumination source 108 may include, but is not limited to, one or more narrow-band laser sources, a broadband laser source, a supercontinuum laser source, a white light laser source, or the like. In this regard, the illumination source 108 may provide an illumination 110 having high coherence (e.g., high spatial coherence and/or temporal coherence). In another embodiment, the illumination source 108 includes a laser-sustained plasma (LSP) source. For example, the illumination source 108 may include, but is not limited to, a LSP lamp, a LSP bulb, or a LSP chamber suitable for containing one or more elements that, when excited by a laser source into a plasma state, may emit broadband illumination. In another embodiment, the illumination source 108 includes a lamp source. For example, the illumination source 108 may include, but is not limited to, an arc lamp, a discharge lamp, an electrodeless lamp, or the like. In this regard, the illumination source 108 may provide an illumination 110 having low coherence (e.g., low spatial coherence and/or temporal coherence).

The illumination 110 from the illumination source 108 may include any spectral content including, but not limited to, ultraviolet (UV) radiation, visible radiation, or infrared (IR) radiation. Further, the illumination 110 may have any bandwidth centered around any center wavelength and/or multiple spectral ranges with different center wavelengths. For example, the illumination 110 may have a narrowband spectrum centered around one or more central wavelengths. The illumination 110 from the illumination source 108 may further have any temporal profile. For example, the illumination 110 may be continuous-wave (CW), pulsed, or otherwise modulated.

In some embodiments, the measurement system 100 directs the illumination 110 to the sample 106 via an illumination pathway 130, which may include at least one of the objective lenses 102. The illumination pathway 130 may further include one or more optical components suitable for modifying and/or conditioning the illumination 110 as well as directing the illumination 110 to the sample 106. For example, the illumination pathway 130 may include one or more illumination-pathway lenses 132 to collimate the illumination 110, to relay pupil and/or field planes, or the like. As another example, the illumination pathway 130 may include one or more illumination-pathway optics 134 to shape or otherwise control the illumination 110. For example, the illumination-pathway optics 134 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In some embodiments, the measurement system 100 directs sample light 116 collected by any combination of the objective lenses 102 to each of one or more detectors 118 via a corresponding collection pathway 136 (e.g., collection channel). The collection pathway 136 may include one or more optical elements suitable for modifying and/or conditioning the sample light 116. For example, the collection pathway 136 may include one or more collection-pathway lenses 138 to collimate the sample light 116, to relay pupil and/or field planes, or the like. As another example, the collection pathway 136 may include one or more collection-pathway optics 140 to shape or otherwise control the sample light 116. For example, the collection-pathway optics 140 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In some embodiments, the measurement system 100 includes one or more channel translation stages 142 suitable for controlling a position of any of the objective lenses 102 and/or other optical elements. For example, the channel translation stages 142 may tilt any of the objective lenses 102 to control the incidence angle of illumination 110 and/or a collection angle of sample light 116 (e.g., to correspond to a diffraction angle of a selected diffraction order). Such adjustments may be made prior to runtime and/or adjusted as needed for any imaged area on the sample 106.

The measurement system 100 may include any number or type of detectors 118. For example, any of the detectors 118 may include a multi-pixel sensor suitable for generating a multi-pixel image of the sample 106 such as, but not limited to, a complementary metal-oxide-semiconductor (CMOS) device, a charge-coupled device (CCD), a photodiode array, or a time-delay-integration (TDI) device.

The one or more detectors 118 may be located at any suitable field planes suitable for capturing an image of the features on the sample 106. In some embodiments, at least one detector 118 and associated elements of the collection pathway 136 (e.g., an objective lens 102) are configured in a Scheimpflug condition in which the plane of the detector 118 is tilted to provide that the entire field of view is simultaneously in focus.

In some embodiment, the measurement system 100 includes a positioning sub-system 144 to position the sample 106 with respect to the objective lenses 102. For example, the positioning sub-system 144 may position and orient the sample 106 with respect to the objective lenses 102. In some embodiments, the positioning sub-system 144 includes one or more adjustable stages such as, but not limited to, a linear translation stage, a rotational stage, or a tip/tilt stage. In some embodiments, the positioning sub-system 144 includes one or more beam-scanning optics (e.g., rotatable mirrors, galvanometers, or the like) to position the illumination 110 with respect to the sample 106).

The controller 120 may include one or more processors 146 configured to execute program instructions maintained on memory 148 (e.g., a memory medium). In this regard, the one or more processors 146 of controller 120 may execute any of the various process steps described throughout the present disclosure. Further, the controller 120 may be communicatively coupled to any component of the measurement system 100 and/or any external systems.

The one or more processors 146 of a controller 120 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 146 may include any device configured to execute algorithms and/or instructions (e.g., program instructions stored in memory). In one embodiment, the one or more processors 146 may be embodied as a desktop computer, mainframe computer system, workstation, image computer, parallel processor, networked computer, or any other computer system configured to execute a program configured to operate or operate in conjunction with the measurement system 100, as described throughout the present disclosure Moreover, different components of the measurement system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 120 may be formed as one or more controllers housed in a common housing or within multiple housings. In this way, any controller or combination of controllers may be separately packaged as a module suitable for integration into the measurement system 100.

The memory 148 may include any storage medium known in the art suitable for storing program instructions executable by the associated one or more processors 146. For example, the memory 148 may include a non-transitory memory medium. By way of another example, the memory 148 may include, but is not limited to, a read-only memory (ROM), a random-access memory (RAM), a magnetic or optical memory device (e.g., disk), a magnetic tape, a solid-state drive and the like. It is further noted that memory 148 may be housed in a common controller housing with the one or more processors 146. In one embodiment, the memory 148 may be located remotely with respect to the physical location of the one or more processors 146 and controller 120. For instance, the one or more processors 146 of controller 120 may access a remote memory (e.g., server), accessible through a network (e.g., internet, intranet and the like).

FIG. 3 is a flow diagram illustrating steps performed in a method 300, in accordance with one or more embodiments of the present disclosure. Applicant notes that the embodiments and enabling technologies described previously herein in the context of the measurement system 100 should be interpreted to extend to the method 300. For example, the processors 146 of the controller 120 may execute program instructions causing the processors 146 to implement any of the steps of the method 300. As another example, various additional components of the measurement system 100 may implement various steps of the method 300. It is further noted, however, that the method 300 is not limited to the architecture of the measurement system 100.

In some embodiments, the method 300 includes a step 302 of directing illumination 110 to one or more targets 104 on a sample 106. For example, one or more targets 104 may be located within a field of view of an illumination objective lens 102 and thus be suitable for simultaneous characterization.

In some embodiments, the method 300 includes a step 304 of collecting light from the sample 106 with one or more collection objective lenses 102, where each of the collection objective lenses 102 is configured to collect a selected diffraction order of the illumination 110 from the one or more targets 104.

In some embodiments, the method 300 includes a step 306 of generating one or more images of the sample 106 based on at least some of the light collected by the one or more collection objective lenses 102. The images may be generated by one or more detectors 118 and may be based on diffraction orders collected by any combination of the collection objective lenses 102.

In some embodiments, the method 300 includes a step 308 of generating measurements of the sample 106 based on the one or more images. Any type of measurement may be generated in step 308. For example, a measurement may include a metrology measurement such as, but not limited to, overlay between two or more sample layers or a critical dimension (CD) measurement of features on a target 104. As another example, a measurement may include an inspection measurement associated with identification and/or classification of defects on the sample 106.

In some embodiments, the method 300 includes a step 310 of controlling one or more process tools based on the one or more measurements. For example, any of the measurements may be provided as feedback and/or feedforward data in a control system. As an illustration, such process tools may include, but are not limited to, a lithography tool (e.g., a scanner, a stepper, or the like), an etching, or a polishing tool. As an illustration, feedback control may be implemented to identify and/or mitigate deviations in one or more process steps between samples in one or more lots. As another illustration, feedforward control may be implemented to utilize measurements of a sample at one process step to influence subsequent process steps applied to the sample.

It is contemplated herein that the method 300 may beneficially provide large field of view imaging suitable for simultaneously imaging multiple targets 104 within the field of view and providing separate measurements associated with each of the imaged targets 104. For example, different portions of an image associated with different targets 104 may be separately analyzed to provide separate measurements. Further, the various targets 104 within the field of view need not have the same design so long as suitable diffraction orders are collected by the collection objective lenses 102. For instance, any number of targets 104 depicted in FIGS. 2A-2C may be simultaneously imaged and analyzed using any of the configurations depicted in FIGS. 1B-1E, though this is merely an illustrating and not limiting. In this way, the method 300 may enable high-throughput measurements of a variety of targets 104 distributed across a sample 106.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A measurement system comprising:

an illumination source configured to generate one or more illumination beams;

one or more objective lenses, wherein one or more of the objective lenses are configured as illumination objective lenses to direct illumination from the illumination source to one or more targets on a sample when implementing a recipe, wherein one or more of the objective lenses are configured as collection objective lenses, wherein each of the collection objective lenses is configured to collect a selected diffraction order of the illumination from the sample when implementing the recipe;

a first detector configured to image the sample based on the positive first-order diffraction when implementing the recipe;

a second detector configured to image the sample based on the negative first-order diffraction when implementing the recipe;

one or more detectors, each configured to image the sample based on at least one of the selected diffraction orders from at least one of the collection objective lenses; and a controller communicatively coupled to the one or more detectors, the controller including one or more processors configured to execute program instructions causing the one or more processors to implement the recipe by generating one or more measurements of the one or more targets on the sample based on one or more images from the one or more detectors, wherein the one or more measurements include an overlay measurement between the first and second layers based on grey-levels associated with the at least one target in the images from the first and second detectors.

2. The measurement system of claim 1, wherein the one or more targets includes two or more targets, wherein the controller is configured to implement the recipe by generating separate measurements of the two or more targets.

3. The measurement system of claim 2, wherein at least two of the two or more targets have different designs.

4. The measurement system of claim 2, wherein at least two of the two or more targets have a common design.

5. The measurement system of claim 1, wherein the illumination objective lenses include a single illumination objective lens.

6. The measurement system of claim 5, wherein the single illumination objective lens is configured to direct the illumination to the sample at a normal incidence angle when implementing the recipe.

7. The measurement system of claim 1, wherein at least one of the one or more measurements comprises:

a metrology measurement.

8. The measurement system of claim 7, wherein the metrology measurement comprises:

an overlay measurement.

9. The measurement system of claim 8, wherein the collection objective lenses comprise:

a first collection objective lens configured to collect positive first-order diffraction of the illumination when implementing the recipe; and a second collection objective lens configured to collect negative first-order diffraction of the illumination when implementing the recipe.

10. The measurement system of claim 9, wherein at least one of the targets include one or more cells in accordance with the recipe, each cell comprising:

first-layer features on a first layer of the sample; and second-layer features on a second layer of the sample.

11. The measurement system of claim 10, wherein the first-layer features and the second-layer features have a common pitch, wherein the first-layer features and the second-layer features at least partially overlap.

12. The measurement system of claim 10, wherein the collection objective lenses further comprise:

an additional objective lens configured to collect zero-order diffraction of the illumination when implementing the recipe.

13. The measurement system of claim 12, wherein the first-layer features and the second-layer features are in non-overlapping regions of the sample, wherein the one or more detectors comprise:

a first detector configured to image the sample based on the positive first-order diffraction and the zero-order diffraction when implementing the recipe; and a second detector configured to image the sample based on the negative first-order diffraction and the zero-order diffraction when implementing the recipe, wherein the one or more measurements include an overlay measurement between the first and second layers based on centers of symmetry of the first-layer features and the second-layer features associated with the at least one target in the images from the first and second detectors.

14. The measurement system of claim 13, wherein the first-layer features and the second-layer features have a common pitch.

15. The measurement system of claim 13, wherein the first-layer features have a first pitch, wherein the second-layer features have a second pitch.

16. The measurement system of claim 15, wherein the illumination includes a first center wavelength and a second center wavelength, wherein the positive first-order diffraction of the illumination with the first center wavelength by the first-layer features overlaps with the positive first-order diffraction of the illumination with the second wavelength by the second-layer features, wherein the negative first-order diffraction of the illumination with the first center wavelength by the first-layer features overlaps with the negative first-order diffraction of the illumination with the second wavelength by the second-layer features.

17. The measurement system of claim 8, wherein the collection objective lenses comprise:

a single collection objective lens to collect zero-order diffraction from the sample when implementing the recipe.

18. The measurement system of claim 17, wherein the zero-order diffraction is transmitted through the sample.

19. The measurement system of claim 1, wherein at least one of the one or more measurements comprises:

an inspection measurement.

20. The measurement system of claim 1, wherein at least one selected diffraction order is a reflected diffraction order.

21. The measurement system of claim 1, wherein at least one selected diffraction order is a transmitted diffraction order.

22. A measurement system comprising:

a controller communicatively coupled to one or more detectors configured to image a sample based on at least some of the light collected by one or more collection objective lenses when implementing a recipe, wherein the one or more detectors comprise a first detector configured to image the sample based on the positive first-order diffraction when implementing the recipe and a second detector configured to image the sample based on the negative first-order diffraction when implementing the recipe, wherein each of the collection objective lenses is configured to collect a selected diffraction order of the illumination from the sample when implementing the recipe, wherein the controller includes one or more processors configured to execute program instructions causing the one or more processors to implement the recipe by generating one or more measurements of the one or more targets on the sample based on one or more images from the one or more detectors, wherein the one or more measurements include an overlay measurement between the first and second layers based on grey-levels associated with the at least one target in the images from the first and second detectors.

23. A method comprising:

directing illumination to one or more targets on a sample;

collecting light from the sample with one or more collection objective lenses and one or more detectors, wherein each of the collection objective lenses is configured to collect a selected diffraction order of the illumination from the one or more targets, wherein the one or more detectors comprise a first detector configured to image the sample based on the positive first-order diffraction when implementing the recipe and a second detector configured to image the sample based on the negative first-order diffraction when implementing the recipe; and generating one or more images of the sample based on at least some of the light collected by the one or more collection objective lenses; and generating one or more measurements of the one or more targets on the sample based on the one or more images, wherein the one or more measurements include an overlay measurement between the first and second layers based on grey-levels associated with the at least one target in the images from the first and second detectors.

24. The method of claim 23, further comprising:

controlling one or more process tools based on the one or more measurements.

* * * * *